United States Patent [19]

Kim et al.

[11] Patent Number: 5,778,520
[45] Date of Patent: Jul. 14, 1998

[54] METHOD OF MAKING AN ASSEMBLY PACKAGE IN AN AIR TIGHT CAVITY AND A PRODUCT MADE BY THE METHOD

[76] Inventors: Jong Tae Kim, #301 Spacevilla 741 Bangbae-Dong. Secho-Gu. Seoul. Rep. of Korea. 137-069; Chan Ik Park, 121-1 Sungbon-Ri Daeso-Myun. Eumsong-Koon. Choong-Book. Rep. of Korea. 369-820

[21] Appl. No.: 675,110

[22] Filed: Jul. 3, 1996

[51] Int. Cl.⁶ ................................................. H01L 23/31
[52] U.S. Cl. ............................................. 29/827; 437/217
[58] Field of Search .............................. 29/827; 257/723; 437/217

[56] References Cited

U.S. PATENT DOCUMENTS

| | | | |
|---|---|---|---|
| 4,862,586 | 9/1989 | Osada | 29/827 |
| 4,894,704 | 1/1990 | Endo | 357/70 |
| 5,504,372 | 4/1996 | Braden et al. | 257/723 |
| 5,557,842 | 9/1996 | Bailey | 29/827 |
| 5,569,625 | 10/1996 | Yoneda et al. | 437/217 |
| 5,594,274 | 1/1997 | Suetaki | 257/667 |

*Primary Examiner*—Rinaldi I. Rada
*Assistant Examiner*—Kevin G. Vereene
*Attorney, Agent, or Firm*—Peter A. Borsari

[57] ABSTRACT

A method of making an assembly having an air tight cavity for holding an element therein and having a plurality of thin and flat planar conductive leads extending outwardly from the cavity for providing electrically conductive paths from the element held within the cavity, and a conductive plate for supporting the circuitry, comprising (a) injecting a liquified thermosetting epoxy into a die and solidifying the epoxy by heat curing to form a dielectric frame that is configured such that the inner end and tip portions of the conductive leads are buried in the frame, the flat surfaces of the intermediate portions of the conductive leads are exposed in a common plane and the outer end portions of the conductive leads extend outside the epoxy. (b) bonding the bottom surface of the resulting dielectric frame to the outer periphery of the conductive base plate. (c) plating the exposed flat surfaces of the conductive leads and the conductive base plate with a conductive material. (d) connecting the circuitry disposed within the opening to the conductive base plate and the exposed flat surfaces of the conductive leads and (f) enclosing the resulting connected circuitry to form an air tight cavity.

22 Claims, 3 Drawing Sheets

METHOD OF MAKING AN ASSEMBLY PACKAGE IN AN AIR TIGHT CAVITY AND A PRODUCT MADE BY THE METHOD

FIELD OF THE INVENTION

The present invention generally relates to a method of making an assembly having an air tight cavity for holding an element therein. More particularly, the present invention relates to a method of an assembly package containing a semiconductor chip, such as GaAs semiconductor circuit chip, in an air tight cavity and inventive products made by the inventive method.

BACKGROUND OF THE INVENTION

An element, such as GaAs semiconductor circuit chip, is housed in an air tight cavity in an assembly package to ensure that the chip functions in the environment in which it is designed to operate. The assembly package includes a dielectric frame through which or on which a plurality of thin conductive leads are disposed. A circuitry, such as a semiconductor chip bonded on a base plate, is wire bonded to the thin conductive leads. In these instances, according to the prior art, either the thin leads are not held in a common plane or they are not firmly fixed in their relative position during the wire bonding process. With no firm support for the thin leads or with a lack of a common plane for the thin leads, the wire bonding process resulted in a poor bonding or no bonding.

To overcome the foregoing problems, according to a prior art, either an injection molded spacer or punched spacer was inserted between the base plate and the thin conductive leads. An epoxy was used to bond the thin leads to the spacer. However, it was found that the epoxy was not applied to a plurality of the leads evenly and in a uniform depth. This resulted in placing the thin leads on uneven surfaces at different planes resulting in poor quality bonds between the leads and the spacer.

Despite the teachings of the prior art, a need still exists for an improved method for making an assembly having an air tight cavity wherein the conductive leads are disposed in a common plane such that the leads can be wire-bonded to a circuitry such as a semiconductor chip in an economical and effective manner.

SUMMARY OF THE INVENTION

In accordance with the present invention, an improved method of making an assembly having an air tight cavity is provided. The assembly comprises three main elements: (1) a conductive lead set comprising a plurality of thin and flat planar conductive leads extending outwardly from the cavity for providing electrically conductive paths from a circuitry (e.g. a semiconductor chip) housed within the cavity, each of the conductive leads comprising an inner end and tip portion, an intermediate portion having a flat surface and an outer end portion; (2) a covering element such as a conductive base plate to cover and enclose the bottom or under surface of the conductive lead set and (3) a cap to cover and enclose the top or upper surface of the conductive lead set. The method comprises the following steps:

(a) injecting a liquified thermosetting epoxy into a die and solidifying the epoxy by heat curing to form a dielectric frame having a top surface, a bottom surface, and an opening disposed therein for housing a circuitry, the dielectric frame being shaped such that the inner end and tip portion of each of the conductive leads is buried in the dielectric frame, the flat surfaces of the intermediate portions of each of the conductive leads is exposed in a common plane, and the outer end portion of each of the conductive leads extends outside the epoxy;

(b) removing the die;

(c) bonding the bottom surface of the dielectric frame to the covering element, for example the conductive base plate to form an air tight seal therebetween;

(d) plating the exposed flat surfaces of the conductive leads and the conductive base plate with a conductive material;

(e) wire bonding the circuitry disposed in the opening of the dielectric frame to the conductive base plate and to the exposed flat surfaces of the conductive leads; and (f) enclosing the wire bonded circuitry disposed in the opening of the dielectric frame to form an air tight cavity.

According to one aspect of the present invention, in making the assembly, a cap is used which covers the frame and encloses the circuitry to form the air tight cavity. The cap may be provided with a hole or pin hole for venting heated air from the cavity during the bonding of the cap to the frame. This hole subsequently is sealed by the further steps of dispensing a liquified thermosetting epoxy into the hole after the bonding between the cap and the frame, and heat curing this dispensed epoxy.

In accordance with yet another aspect of the invention, the conductive base plate is provided with recessed grooves along the outer periphery thereof to strengthen the bonding between the conductive base plate and the dielectric frame.

According to a further aspect of the invention, a method of making a plurality of assemblies is provided, each assembly for housing a semiconductor chip in an air tight cavity, which method comprises the steps of:

(a) selecting a first strip having a plurality of conductive lead sets, each set comprising a plurality of thin and planar conductive leads arranged in a predetermined pattern, each of the conductive leads comprising an inner end and tip portion, an intermediate portion having a flat surface and an outer end portion;

(b) selecting a second strip having a plurality of conductive base plates corresponding in number to said plurality of conductive lead sets, each of the conductive base plates having an outer periphery;

(c) placing the first strip in a die and injecting a liquified thermosetting epoxy and heat curing said epoxy to form a plurality of dielectric frames corresponding to the plurality of conductive lead sets, each of the dielectric frames having a top surface, a bottom surface and an opening disposed therein for housing a semiconductor chip, and each of the dielectric frames being shaped such that for each corresponding conductive lead set, the inner end and tip portion of each of said conductive leads is buried in the corresponding dielectric frame, the intermediate portions of the flat surfaces of each of said conductive leads are exposed in a common plane, and the outer end portion of each of said conductive leads extends outside the epoxy of the corresponding dielectric frame;

(d) removing the die;

(e) dispensing a liquefied thermosetting epoxy to the bottom surface of each of the dielectric frames;

(f) bonding the bottom surface of the plurality of dielectric frames to the outer periphery of the corresponding conductive base plate to form an air tight seal between the conductive base plate and the corresponding dielectric frame;

(g) plating the exposed flat surfaces of each of the plurality of conductive leads and the corresponding plurality of conductive base plates with a conductive material;

(h) providing a plurality of semiconductor chips corresponding in number to the plurality of conductive base plates and to the plurality of conductive lead sets and connecting a semiconductor chip to a corresponding conductive base plate and to the exposed flat surfaces of a corresponding conductive lead set; and (i) enclosing each of the semiconductor chips diposed within a housing formed by the opening between the plurality of dielectric frames and corresponding plurality of conductive base plates to form a plurality of air tight cavities.

A further aspect of the present invention is the products made according to the present inventive method disclosed herein.

The foregoing and other aspects of the invention will be made clearer from the detailed description given below in conjunction with the accompanying drawings.

DETAILED DESCRIPTION OF THE INVENTION

The present invention will be described in terms of a method of making an assembly having an air tight cavity containing a GaAs semiconductor chip and inventive products made by the method with reference to the accompanying drawings. But it should be noted that the principles of the inventive method are not limited to making an assembly having an air tight cavity for a GaAs chip or any other type of semiconductor chips or circuitry. Rather, the inventive method may be applied to make an assembly having an air tight cavity to contain any other types of products, such as LCD, MMIC and other electronic or non-electronic elements.

DETAILED DESCRIPTION OF THE COMPONENTS

Structural Elements of the Assembly

Figure 1:
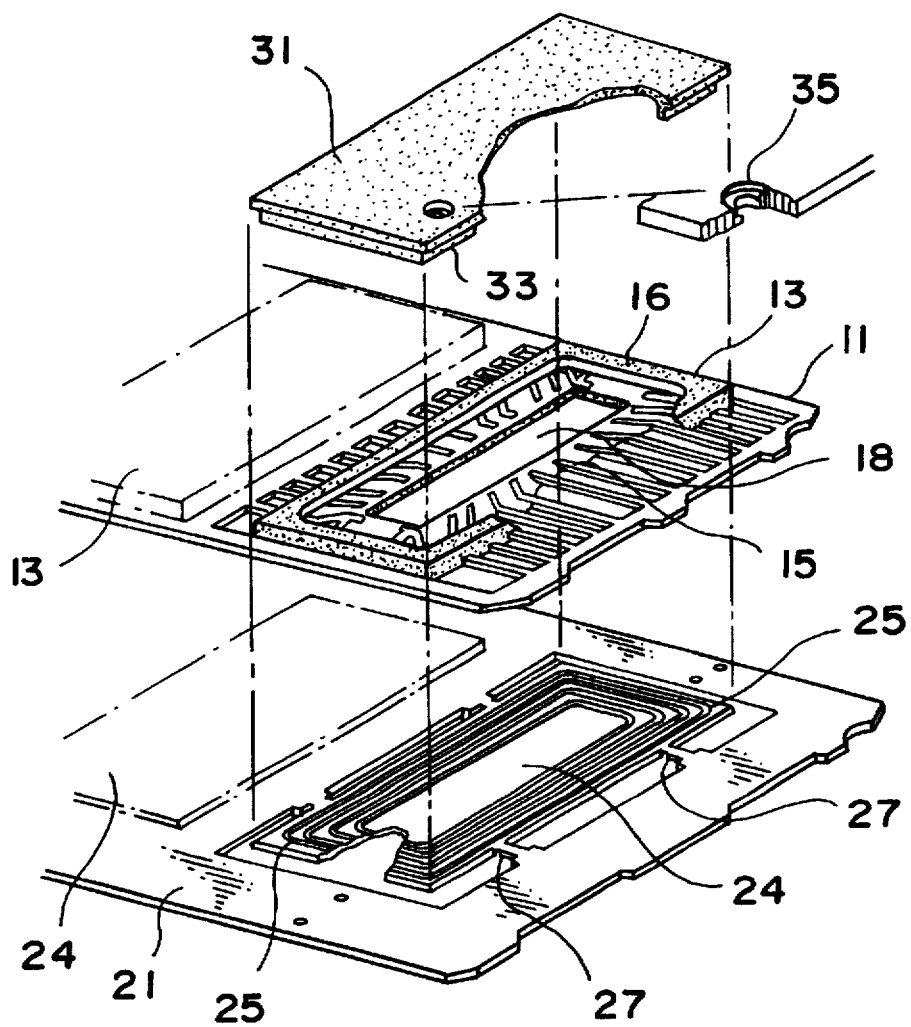
FIG. 1 shows an expanded top perspective view of an assembly made according to the present invention.
Figure 2:
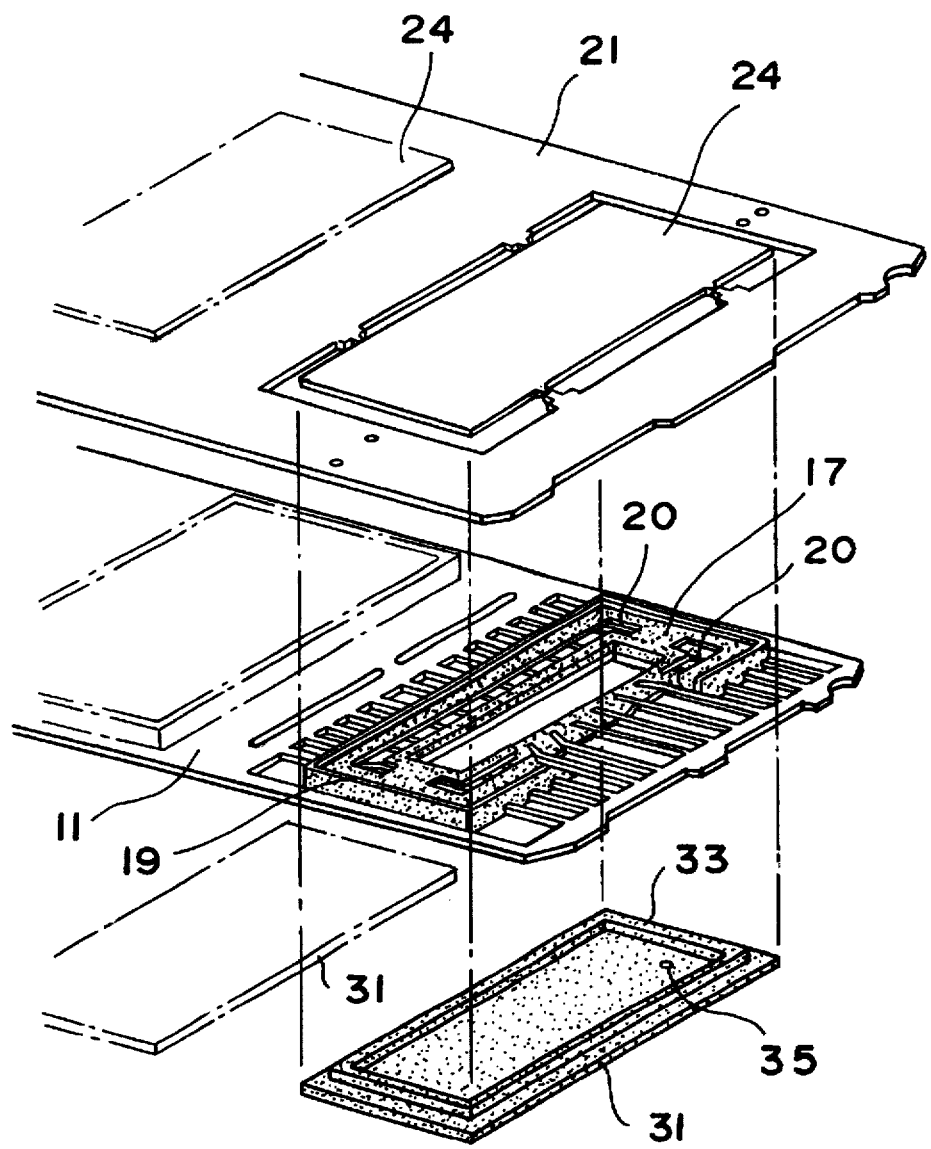
FIG. 2 shows show an expanded bottom perspective view of the assembly made according to the present invention.
Figure 3:
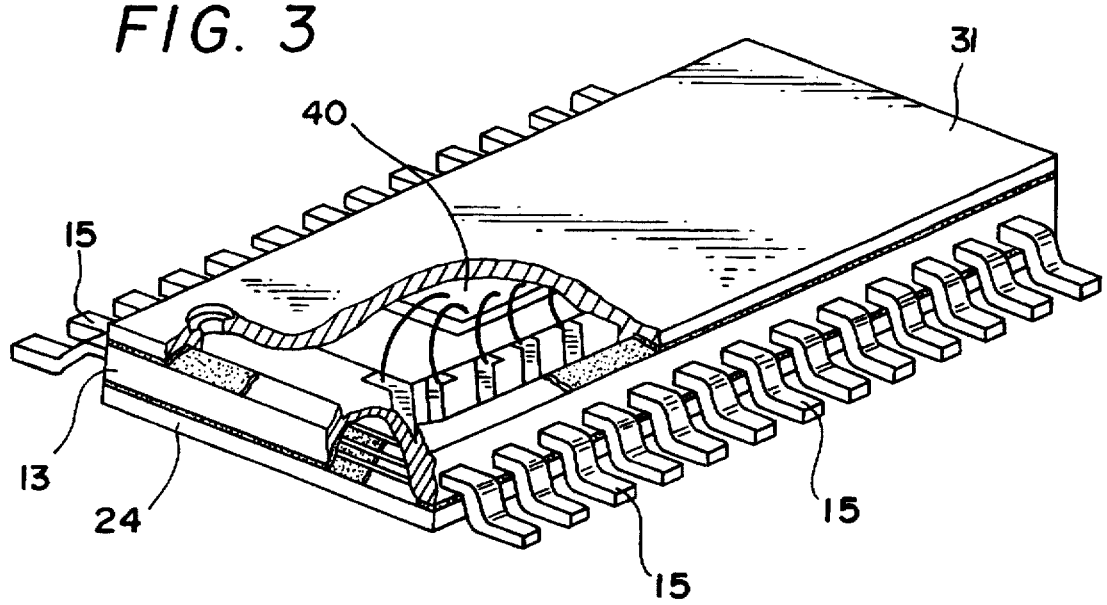
FIG. 3 shows a perspective view of an assembly according to the present invention.
Figure 4:
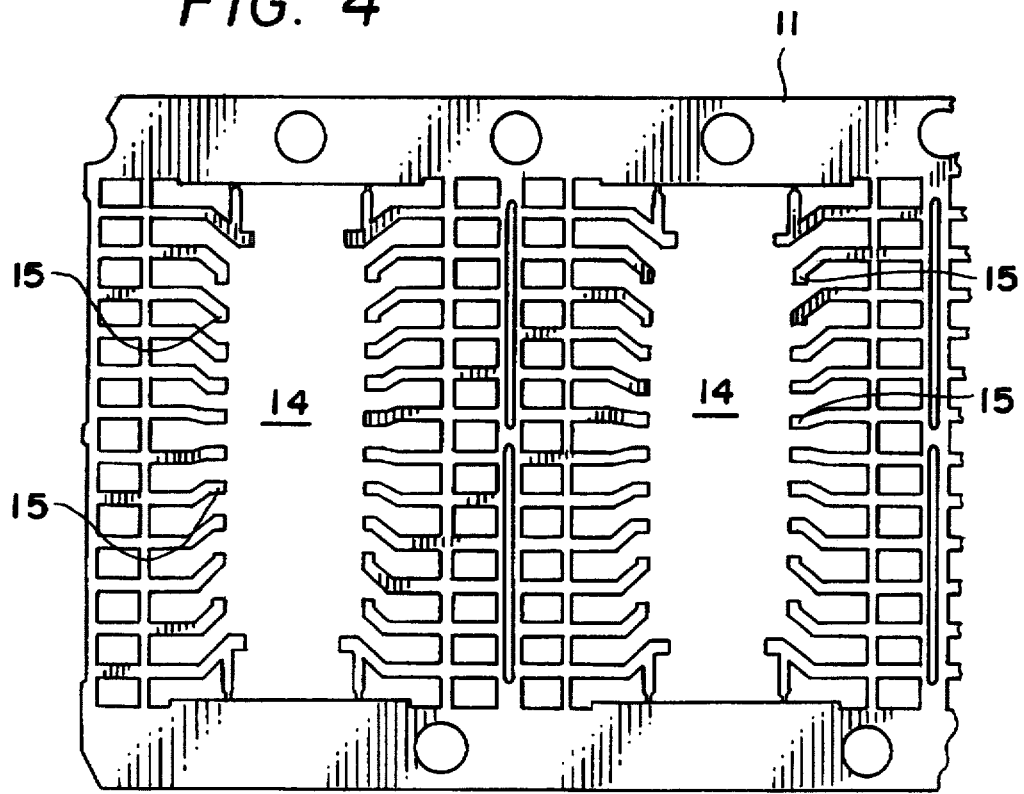
FIG. 4 shows a detail of a strip with a plurality of leads in sets.

Referring to drawings, there is shown, in FIG. 1, an expanded top perspective view of an assembly. FIG. 2 shows expanded bottom perspective of the same. FIG. 3 shows a perspective drawing of the assembly according to the present invention, with portions broken away to show the inside of the assembly. FIG. 4 shows a strip of conductive tape having two dielectric frames, each having a conductive lead set comprising a plurality thin and planar conductive leads arranged in a predetermined pattern. Although two dielectric frames and two conductive lead sets are shown, it is to be understood that a plurality of dielectric frames and corresponding conductive lead sets can be used in the present invention. For instance, the conductive strip may be provided with only one dielectric frame and corresponding conductive lead set. Or, a longer strip of conductive tape can be used having a plurality of conductive lead sets. For example, the conductive tape may contain fourteen (14), twenty (20) or even more conductive lead sets that can be conveniently handled by the etching process and assembling processes.

The assembly made by the present inventive method comprises three main elements. The first element is the first conductive strip 11 which is more fully shown in FIG. 4 comprising at least one conductive lead set 14 having a plurality of thin and planar conductive leads 15. Preferably, the conductive strip 11 comprises a plurality of conductive lead sets 14, such as the two lead sets shown in FIG. 4. In the conductive strip 11, the thin, flat and planar conductive leads 15 are prearranged in sets in a series, as shown in FIG. 4 in detail. The conductive leads are etched out in a prearranged pattern from a thin conductive plate to provide electrically conductive paths as required by the circuitry of the chip.

The first element also has a dielectric frame 13 molded onto the thin and planar conductive lead set as illustrated in FIGS. 1 and 2. Preferably, a plurality of dielectric frames are provided corresponding in number to the plurality of conductive lead sets. Thus, each dielectric frame 13 is molded onto the corresponding conductive lead set 14 in an integrated and unified structure in the first strip. The frame is shaped in a certain way, as will be more fully described below, that makes a highly reliable accurate wire bonding process possible. The frame also makes the entire process to be a high quality and high yield assembly process.

The second element of the assembly is a second strip 21 comprising at least one conductive base plate 24. Preferably, the second strip 21 is made of a plurality of the conductive base plates 24 corresponding in number to the plurality of conductive lead sets 14. Land bridges 27 are provided to hold the plurality of conductive base plates 24 in place in series. The bridges 27 can be broken off readily when required upon completion of the assembling process. A plurality of recessed grooves 25 may be formed on the outer periphery of each of the base plates 24. The use of these recessed grooves 25, filled with liquified thermosetting epoxy, establishes better bonding when the base plates 24 are bonded to the dielectric frames 13 in the first strip 11.

The third element is at least one and preferably a plurality of caps 31 corresponding in number to the plurality of conductive lead sets 14, each cap 31 designed to cover the corresponding cavity formed by the dielectric frames 13 and the base plates 24. The cap 31 is provided with a protruding outer rim 33, as shown in FIG. 1.

Referring to the first conductive strip 11, a plurality of conductive lead sets 14 comprising a plurality of the thin conductive leads 15 may be etched out from a first thin planar conductive strip 11 in a conventional manner. Each of the plurality of conductive leads 15 comprises an inner end and tip portion, an intermediate portion having a flat surface and an outer end portion. A plurality of the conductive base plates 24 corresponding in number to the plurality of conductive lead sets 14 are stamped in the second strip 21 and the conductive base plates 24 are dimensioned and located to mate with the corresponding dielectric frames 13 having the corresponding set of conductive leads 15. All of the conductive leads 15 in the conductive lead sets are molded in dielectric epoxy frames 13 in the first strip 11 and then the frames 13 are bonded to the corresponding plates 24 in the second strip 21, as will be more fully described below. The two strips so bonded together are then plated with a conductive material, including for example, silver.

The conductive base plates 24 can be used as heat sinks as well as electrical ground for the semiconductor chips 40. The grounding for each conductive plate 24 is accomplished by wire bonding the grounding element in the circuitry to the ground lead of the conductive leads 15. The base plates 24 also function as support pads for the circuitry or chips 40 while the chips are wire bonded thereto.

Strong bonds are established between the base plates 24 and the dielectric epoxy frames 13, with liquefied thermosetting epoxy dispensed in the recessed grooves 25 provided at the outer periphery of each of the base plates 24 before the dielectric frames 13 are bonded to the base plates. After the base plates are bonded to the corresponding dielectric frames by the epoxy and heat cured, the assemblies are plated with a conductive material, such as silver.

Transfer Molded Plastic Body Containing the Conductive Leads

The following discussion is directed to the formation of a single dielectric frame 13. However, it is to be understood that a plurality of dielectric frames can be produced in a similar manner. A die, not shown, is used to mold a thermosetting epoxy onto the conductive lead set 14 comprising a plurality of conductive leads 15 in a certain manner as described below to form the dielectric frame 13 as illustrated in FIGS. 1 and 2.

The thermosetting epoxy is transfer molded to embed the plurality of flat and thin conductive leads 15 as an integral and unified structural part of the dielectric frame 13. This is made possible by the shape of the interior of the die used to receive the liquefied thermosetting epoxy and solidify the epoxy into a dielectric frame of a certain shape. Preferably, the thermosetting epoxy molding compound is injected into the die at a temperature of about 180° C. At this temperature, solidification of the epoxy occurs in about one to about two minutes. The interior of the die shapes the dielectric frame 13 into a relatively flat shape such that the inner end and tip portion of each of the conductive leads 15 is buried in the dielectric frame, the intermediate portion of each of the conductive leads are embedded in the frame such that the flat surfaces are exposed, and the outer end portion of the conductive leads 15 extend outside the epoxy dielectric frame, as shown in FIGS. 1 and 2.

The dielectric frame 13 formed by the die comprises a top surface 16, a bottom surface 17, an opening 18 disposed therein and an outer rim 19. Opening 18 is used for housing the circuitry or chip 40 that will be introduced later in the assembling process. The bottom surface 17 of the frame has an outer protruding rim 19 of a uniform thickness and height and has a plurality of recessed channels 20 therein. The top surface 16 of the dielectric frame is flat and is recessed at an intermediate area such that the flat surfaces of the intermediate portion of each of the conductive leads 15 are exposed and lie in a common plane.

The bottom surface 17 of the dielectric frame and the outer periphery of the conductive base plate 24 are designed, shaped and dimensioned with very close tolerances relative to each other in order to enable them to mate tightly with one another when they are brought together. As discussed above, the outer periphery of each conductive base plate 24 is provided with a plurality recessed grooves 25. To bond the conductive base plate 24 to the dielectric frame 13, a bonding material, such as a liquefied thermosetting epoxy at about room temperature, is dispensed into and fills the channels 20 of the bottom surface 17 of the dielectric frame 13 and also is dispensed into and fills the recessed grooves 25 of the conductive base plate 24. The bottom surface 17 then is pressed against the epoxy coated base plate 24 and the epoxy is heat cured at a temperature of about 100° C. for about one hour to bond the dielectric frame 13 to the conductive base plate 24. The resulting seal made by the epoxy is air tight.

The following salient characteristics of the dielectric frame are noted. The thin conductive leads 15 embedded in the frame become an integral part of the body of the dielectric frame 13, thereby maintaining the spatial and physical integrity of the component elements embedded therein. The frame 13 also provides solid support to the plurality of conductive leads 15. Thus, the thermally setting epoxy molding compound used for forming the dielectric frame 13 surrounds the thin and flat leads completely, except for the flat surfaces of the intermediate portion of each of the conductive leads 15 which are left exposed to be wire bonded.

These exposed portions of the thin conductive leads 15 are supported by the frame underneath the leads, thereby strengthening and maintaining the physical integrity and the spatial relationship of the leads to the rest of the elements involved in the assembling process. This integral and solid structure enables the leads to remain in position during the wire bonding processes.

After the conductive base plate 24 is bonded to the bottom surface 17 of the dielectric frame, the exposed flat surfaces of conductive leads 15 and conductive base plate 24 are plated. A circuitry or chip 40 is introduced into the opening 18 and connected to the conductive base plate 24. The circuitry or chip 40 then is wire bonded to the exposed flat surfaces of the plurality of conductive leads 15.

The assembly is enclosed to form an air tight cavity by covering the opening 18 disposed within the dielectric frame 13 having the circuitry or chip 40 housed therein with the cap 31. The cap 31, which may be composed of a thermosetting plastic material, is provided with a protruding outer rim 33. The rim 33 has a uniform thickness and height and is configured to mate with the top surface 16 of the dielectric frame 13 and form a tight fit when closed.

After the chip 40 is wire bonded to the conductive leads 15, a liquefied thermosetting epoxy at about room temperature is dispensed to the top surface 16 of the dielectric frame 13 and the cap is closed over the top surface 16 contacting the dispensed epoxy. Because of the complementary design of the outer rim 33 of the cap 31 and the top surface 16 of the dielectric frame 13 as described above, when closed, the cap 31 tightly mates with the top surface 16 of the dielectric frame 13. In the foregoing manner, a cavity is formed by the dielectric frame 13, the conductive base plate 24 and the cap 31. The epoxy is heat cured, thereby bonding the cap 31 to the dielectric frame 13, sealing the cavity and making it air tight.

The cap 31 may be provided with a hole or pin hole 35. The use of a pin hole 35 allows hot air to escape from the cavity while the assembly is heated to cure the epoxy used to bond to the cap 31 to the top surface of the dielectric frame 13. As the heat curing nears completion, the pin hole 35 is sealed with a drop of the thermosetting epoxy. The use of the pin hole to vent the heated air relieves the pressure exerted by the expanding air in the heated cavity during the heat curing of the epoxy bonding the cap 31 to the top surface of the dielectric frame 13. By providing an escape vent for the heated air, the heat curing of the epoxy between the dielectric frame 13 and the cap 31 can be conducted at a higher temperature resulting in a lesser required time to heat cure the epoxy.

The Assembling Process

In making a plurality of assemblies each having an air tight cavity for housing a circuitry or semiconductor chip 40, a first conductive strip 11 comprises a pre-etched and predetermined plurality of conductive lead sets 14, each set comprising a plurality of thin and planar conductive leads 15 arranged in a predetermined pattern. The conductive lead sets 14 are transfer molded with a thermosetting epoxy. As previously described, the thermosetting epoxy is molded over the conductive lead sets 14 by injecting the liquefied thermosetting epoxy into a die having an interior configured to form a plurality of dielectric frames 13 corresponding to the number of conductive lead sets 14, each dielectric frame being of a certain shape as described above in detail in conjunction with FIGS. 1 and 2. The thermosetting epoxy is heat cured and solidifies to form the dielectric epoxy frame as described above. The die is separated from the epoxy frame after it solidifies.

After the dielectric frames 13 are removed from the die, a liquefied thermosetting epoxy at about room temperature is dispensed to the bottom surface 17 of each of the plurality of dielectric frames 13 in the areas corresponding to the recessed grooves 25 of the plurality of conductive base plates 24 of second strip 21. Liquefied thermosetting epoxy at about room temperature also is dispensed to the outer periphery of each of the plurality of conductive base plates 24 where the recessed grooves 25 are located, corresponding to bottom surface 17 of each of the plurality of dielectric frames 13 surrounding the openings 18 in each of the plurality of dielectric frames 13.

The first strip 11 having the plurality of dielectric frames 13 then is aligned with and pressed against the second strip 21 having the plurality of conductive base plates 24 in such a manner that the bottom surface of each of the plurality of dielectric frames contacts the liquefied epoxy at about room temperature on the corresponding base plate 24. The plurality of dielectric frames 13 are pressed against the corresponding base plates 24 to bond them together by heat curing the dispensed epoxy at a temperature of about 100° C. for about a period of about one hour. In this manner, an air tight seal is formed between each of the plurality of conductive base plates 24 and the bottom surface 17 of the corresponding dielectric frames 13. This results in the first strip 11 and second strip 21 being attached to each other and becoming a unified structure. Additionally, once each of the plurality of conductive base plates 24 is bonded to the bottom surface of each of the plurality of dielectric frames 13, the openings 18 disposed within the dielectric frames 13 become suitable for housing a circuitry or semiconductor chip 40 or similar element.

Following the bonding of the first and second strips, the two strips are plated with a conductive material, such as a metallic compound, including for example silver, in any conventional manner well known in the art. This plating step results in the plating of the exposed portions, that is the flat surfaces of the intermediate portions of the conductive leads 15 of each conductive lead set 14, the remaining portion of the first strip 11 and the exposed parts of the second conductor strip 21 that are metallic. As the dielectric frames 13 are composed of epoxy, they do not take the metal plating and remain unplated.

Following the plating step, a circuitry, semiconductor chip 40 or the like is connected to the conductive leads 15 and conductive base plate 24. More specifically, a plurality of circuitry elements, such as plurality of GaAs or MMIC chips 40, first are attached to a corresponding conductive base plate 24, such as by conductive epoxy. The chip 40 then is wire bonded to the exposed flat surfaces of the conductive leads 15 of a corresponding lead set 14 contained in a corresponding dielectric frame 13 in a conventional manner.

After the chip 40 has been wire bonded, each opening 18 in the plurality of dielectric frames 13 is enclosed. Preferably, each opening 18 is enclosed by dispensing a liquefied thermosetting epoxy at about room temperature to the top surface of each of the plurality of dielectric frames 13 and contacting each of the epoxy coated top surfaces with a corresponding cap 31 having a protruding outer rim 33. The thus-placed caps 31 are bonded to the plurality of dielectric frames 13 by heat curing the epoxy to a temperature of about 100° C. for a period of about an hour, thereby forming a plurality of air tight cavities. Subsequently, the epoxy disposed in the assembly may be further heat cured in a conventional manner at an elevated temperature of about 150° C. for a period of about 2 hours.

As described above, each cap 31 may be provided with a hole or pin hole 35. The opening provided by the hole or pin hole 35 acts as a vent for the air in the cavity being heated during the heat curing of the epoxy bonding the cap to the frame. In this step, the bonding between the caps 31 and the corresponding dielectric frames 13 take place faster and more reliably and solidly in that the holes 35 provide a means for the heated air to escape and reduce the uplifting pressure against the caps that tend otherwise to lift the caps from the frames.

Additionally, by providing the pin hole 35 in each of the caps 31, the heat curing time can be reduced further by heat curing the epoxy at a higher temperature, for example, as high at about 170° C., instead of the temperature of about 100° C. when the cap is not provided with a pin hole 35. At this higher temperature, the heat curing of the thermosetting epoxy bonding the dielectric frames to the caps can be completed in as few as about three to about five minutes. The temperature then is reduced to about 140° C. and the holes are sealed with thermosetting epoxy in about three minutes.

The whole assembly then may be placed in an oven for a period of about 2 hours at a temperature of about 150° C. to cure further the epoxy between the cap and the frame and between the frame and the base plate. Thereafter, the unnecessary parts of the second strip 21 are removed by stripping off the first strip 11 having the plurality of dielectric frames 13 bonded to the corresponding plurality of conductive base plates 24. Because of the strong and air tight seal between the plurality of conductive base plates 24 in the second strip 21 and the bottom surfaces of the corresponding dielectric frames 13, the base plates 24 remain firmly bonded to the corresponding dielectric frame 13 as the second strip 21 is separated from the first strip.

In the present assembling processes, conventional automated machines are used for the wire bonding and epoxy dispensing steps. In this process, the second strip with the base plates serves the function of the "boat" carrying the first strip with the frames for the remainder of the assembling process once the bottom of the frames are bonded to the base plates of the second strip.

The significance of the "boat" function of the second strip is that the second strip enables the spatial relationship, that is, the distances from the assembly to the assembly and from the leads of each set to the next set to remain fixed and constant. This allows the steps of attaching or bonding the chips 40 to the base plates 24, bonding of the wires from the chips 40 to the exposed flat surfaces of the thin conductive leads 15 on the dielectric frames 13 and the placement of the caps 31 over the frames very reliable, precise and accurate. Thus, the "boat" function of the second strip makes the whole automated system produce more reliable, accurate and high quality assemblies.

Upon completion of the processes for making the assemblies, each of the described assemblies are separated by cutting the outer end of each of the thin conductive leads extending out from each of the dielectric frames. The cut conductive leads extending outwardly from the frames then are gull winged in one continuous motion after the leads have been cut in a conventional manner.

Various changes and modifications may be made to the invention described herein above by the persons of ordinary skill without departing from the spirit and the scope thereof.

What is claimed is:

1. A method of making an assembly having an air tight cavity, said assembly comprising:
   (1) a plurality of thin and flat planar conductive leads extending outwardly from said cavity for providing electrically conductive paths from a circuitry held within said cavity, each of said conductive leads comprising an inner end and tip portion, an intermediate portion having a flat surface and an outer end portion; and
   (2) a conductive base plate for supporting said circuitry, said conductive base plate having an outer periphery, the method comprising the steps of:
      (a) injecting a liquified thermosetting epoxy into a die and solidifying by heat curing said epoxy to form a dielectric frame having a top surface, a bottom surface and an opening disposed therein for placing said circuitry, said frame being shaped such that said inner end and tip portions of said conductive leads are buried in said frame, the flat surfaces of said intermediate portions of said conductive leads are exposed in a common plane, the outer end portions of said conductive leads extend outside the epoxy and said circuitry is disposed within said opening;
      (b) removing said die;
      (c) bonding said bottom surface of said dielectric frame to said outer periphery of said conductive base plate;
      (d) plating said exposed flat surfaces of said conductive leads and said conductive base plate with a conductive material;
      (e) connecting said circuitry disposed within said opening to said conductive base plate and said exposed flat surfaces of said conductive leads; and
      (f) enclosing the resulting connected circuitry to form an air tight cavity.

2. The method of making an assembly having an air tight cavity according to claim 1, wherein step (e) comprises the steps of:
   (e1) attaching said circuitry disposed within said opening to said conductive base plate; and
   (e2) wire bonding said circuitry to said exposed flat surfaces of said conductive leads.

3. The method of making an assembly having an air tight cavity according to claim 1, wherein said enclosing step (f) comprises the steps of:
   (f1) dispensing a liquefied thermosetting epoxy to said top surface of said dielectric frame;
   (f2) placing a cap over said top surface of said dielectric frame to enclose said wire bonded circuitry disposed within said opening to form a closed cavity; and
   (f3) heat curing said epoxy between said cap and said top surface of said dielectric frame to form an assembly having an air tight cavity.

4. The method of making an assembly having an air tight cavity according to claim 3, wherein the resulting assembly having an air tight cavity is heated at an elevated temperature to further heat cure the epoxy between said dielectric frame and said conductive base plate and between said dielectric frame and said cap.

5. The method of making an assembly having an air tight cavity according to claim 3, wherein said cap has a pin hole disposed therein for venting air from said cavity while said epoxy is being heat cured.

6. The method of making an assembly having an air tight cavity according to claim 5, further comprising the step of:
   (g) dispensing a liquified thermosetting epoxy into said pin hole following said heat curing step (f3) and heat curing said epoxy in order to seal said hole.

7. The method of making an assembly having an air tight cavity according to claim 5, further comprising the step of:
   (g) reducing the temperature utilized in the heat curing step (f3) near the completion of said heat curing step (f3) to a temperature still capable of heat curing said epoxy, dispensing a liquified thermosetting epoxy into said pin hole of said cap and heat curing said epoxy at said reduced temperature in order to seal said hole.

8. The method of making an assembly having an air tight cavity according to claim 1, wherein said bonding step (c) comprises the steps of:
   (c1) dispensing a liquified thermosetting epoxy to said bottom surface of said dielectric frame;
   (c2) dispensing a liquified thermosetting epoxy to said outer periphery of said conductive base plate;
   (c3) pressing the epoxy-dispensed bottom surface of said dielectric frame against the epoxy-dispensed conductive base plate; and
   (c4) heat curing the epoxy between said dielectric frame and said conductive base plate to form an air tight seal between said bottom surface of said dielectric frame and said conductive base plate.

9. The method of making an assembly having an air tight cavity according to claim 8, wherein said conductive base plate has a plurality of recessed grooves along said outer periphery thereof to receive a liquified thermosetting epoxy in order to strengthen said bonding between said conductive base plate and said dielectric frame.

10. The method of making an assembly having an air tight cavity according to claim 8, wherein said bottom surface of said dielectric frame has a plurality of recessed channels to receive a liquified thermosetting epoxy.

11. A method of making an assembly having an air tight cavity for housing a semiconductor chip therein, said assembly comprising a dielectric frame having a top surface, a bottom surface and an opening disposed therein, and a plurality of thin and flat planar conductive leads extending outwardly from said cavity and embedded through said dielectric frame, said conductive leads providing electrically conductive paths from said chip to outside said dielectric frame, the method comprising the steps of:
   a) bonding said bottom surface of said dielectric frame to form an air tight seal between said bottom surface and said conductive base plate;
   b) dispensing a thermosetting epoxy to said top surface of said dielectric frame;
   c) placing a cap having a pin hole disposed therein over said top surface to form a closed cavity;
   d) heat curing said epoxy at an elevated temperature such that said pin hole vents heated air from said closed cavity during the curing process; and e) filling said pin hole with a thermosetting epoxy and heat curing said epoxy to seal said pin hole and form an air tight cavity.

12. A method of making a plurality of assemblies, each assembly having an air tight cavity for housing a semiconductor chip therein, comprising the steps of:

(a) selecting a first strip having a plurality of conductive lead sets, each set comprising a plurality of thin and planar conductive leads arranged in a predetermined pattern, each of said conductive leads comprising an inner end and tip portion, an intermediate portion having a flat surface and an outer end portion;

(b) selecting a second strip having a plurality of conductive base plates corresponding in number to said plurality of conductive lead sets, each of said plurality of conductive base plates having an outer periphery;

(c) placing said first strip in a die and injecting a liquified thermosetting epoxy and heat curing said epoxy to form a plurality of dielectric frames corresponding to said plurality of conductive lead sets, each of said dielectric frames having a top surface, a bottom surface and an opening disposed therein for containing said semiconductor chip, each of said dielectric frames being shaped such that for each corresponding conductive lead set, the inner end and tip portion of each of said conductive leads is buried, the flat surfaces of the intermediate portion of each of said conductive leads are exposed in a common plane, and the outer end portion of each of said conductive leads extends outside the epoxy, of the corresponding dielectric frame;

(d) removing the die;

(e) dispensing liquefied thermosetting epoxy to the bottom surface of each of said plurality of dielectric frames;

(f) bonding the bottom surface of each of said plurality of dielectric frames to said outer periphery of said corresponding plurality of conductive base plates in order to form an air tight seal between each of said plurality of dielectric frames and said corresponding plurality of conductive base plates.

(g) plating the exposed flat surfaces of each of said plurality of conductive lead sets and said corresponding plurality of conductive base plates with a conductive material.

(h) providing a plurality of semiconductor chips corresponding in number to said plurality of conductive base plates and to said plurality of conductive lead sets and connecting a semiconductor chip to its corresponding conductive base plate and set of conductive leads; and (i) enclosing each of the resulting connected circuitry to form a plurality of air tight cavities corresponding in number to said plurality of dielectric frames.

13. The method of making a plurality of assemblies according to claim 12, wherein step (h) comprises the steps of:

(h1) attaching each of said plurality of semiconductor chips to its corresponding conductive base plate; and (h2) wire bonding each of said semiconductor chips to said plated exposed flat surfaces of its corresponding conductive lead set.

14. The method of making a plurality of assemblies according to claim 12, wherein said encapsulating step (i) comprises the steps of (i1) dispensing a liquefied thermosetting epoxy on said top surface of each of said plurality of dielectric frames;

(i2) providing a plurality of caps corresponding in number to said plurality of said dielectric frames, and placing each of said plurality of caps over said top surface of a corresponding dielectric frame to form a plurality of closed cavities; and (i3) heat curing the epoxy between said plurality of caps and said top surfaces of said plurality dielectric frames to form a plurality of air tight cavities.

15. The method of making a plurality of assemblies according to claim 14, wherein each of said plurality of caps has a pin hole disposed therein for venting air from said corresponding cavity while said epoxy dispensed on said top surface of each of said plurality of dielectric frames is being heat cured.

16. The method of making a plurality of assemblies according to claim 15, further comprising the step of:

(j) dispensing a liquified thermosetting epoxy into each of said pin holes of each of said caps following said heat curing step (i3) and heat curing said epoxy in each of said pin holes in order to seal said pin holes.

17. The method of making a plurality of assemblies according to claim 14, wherein each of said plurality of caps has a bottom surface configured with a protruding outer rim and wherein said top surface of each of said plurality of dielectric frames has a protruding outer rim such that when each of said plurality of caps is placed over said top surface of said corresponding dielectric frame, said outer rim of said bottom surface of each of said plurality of caps fits tightly within said outer rim of said top surface of said corresponding dielectric frame.

18. The method of making a plurality of assemblies according to claim 12, further comprising the step of:

(k) cutting and gulling the outer portion of each of said plurality of conductive leads extending out of each of said plurality of dielectric frames to form a plurality of individual assemblies each having an air tight cavity.

19. The method of making a plurality of assemblies according to claim 12, wherein each of said plurality of conductive base plates comprises a plurality of recessed grooves along said outer periphery thereof to receive a liquified thermosetting epoxy in order to strengthen the bonding between the bottom surface of each of said plurality of dielectric frames and its corresponding conductive base plate.

20. The method of making a plurality of assemblies according to claim 19, wherein the bottom surface of each of said plurality of dielectric frames comprises a plurality of recessed channels to receive a liquefied thermosetting epoxy in order to strengthen the bonding between the bottom surface of each of said plurality of dielectric frames and its corresponding conductive base plate.

21. The method of making a plurality of assemblies according to claim 12, wherein the bottom surface of each of said plurality of dielectric frames comprises a plurality of recessed channels to receive a liquefied thermosetting epoxy in order to strengthen the bonding between the bottom surface of each of said plurality of dielectric frames and its corresponding conductive base plate.

22. The method of making a plurality of assemblies according to claim 12, wherein said bottom surface of each of said plurality of dielectric frames has a protruding outer rim configured in such a manner that said corresponding conductive base plate is tightly mated within the outer rim when said bottom surface of each of said plurality of dielectric frames is bonded to said corresponding conductive base plate, and wherein said outer rim retains the epoxy within said outer rim.

* * * * *